(12) United States Patent
Givens et al.

(10) Patent No.: US 6,689,693 B2
(45) Date of Patent: *Feb. 10, 2004

(54) METHODS FOR UTILIZATION OF DISAPPEARING SILICON HARD MASK FOR FABRICATION OF SEMICONDUCTOR STRUCTURES

(75) Inventors: John H. Givens, San Antonio, TX (US); Mark E. Jost, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/267,063

(22) Filed: Oct. 7, 2002

(65) Prior Publication Data

US 2003/0036271 A1 Feb. 20, 2003

Related U.S. Application Data

(63) Continuation of application No. 09/651,462, filed on Aug. 30, 2000, now Pat. No. 6,461,963.

(51) Int. Cl.[7] ............................................. H01L 21/302
(52) U.S. Cl. ...................... 438/692; 438/701; 438/706; 438/712
(58) Field of Search ................................. 438/692, 701, 438/706, 710, 712, 719, 720, 725

(56) References Cited

U.S. PATENT DOCUMENTS

| | | | |
|---|---|---|---|
| 4,473,435 A | 9/1984 | Zafiropoulo et al. ........ 156/643 |
| 4,619,037 A | 10/1986 | Taguchi et al. | |
| 4,631,806 A | 12/1986 | Poppert et al. ................ 29/589 |
| 5,173,442 A | 12/1992 | Carey .......................... 437/173 |
| 5,174,858 A | 12/1992 | Yamamoto et al. | |
| 5,244,837 A | 9/1993 | Dennison ..................... 437/195 |
| 5,340,370 A | * 8/1994 | Cadien et al. ................. 51/308 |
| 5,422,309 A | 6/1995 | Zettler et al. ................ 437/192 |
| 5,466,639 A | 11/1995 | Ireland ........................ 437/195 |
| 5,468,342 A | 11/1995 | Nulty et al. | |
| 5,582,881 A | 12/1996 | Besser et al. ................ 427/576 |
| 5,602,423 A | 2/1997 | Jain ............................ 257/752 |
| 5,612,254 A | 3/1997 | Mu et al. ..................... 437/195 |
| 5,635,423 A | 6/1997 | Huang et al. ................ 437/195 |
| 5,651,855 A | 7/1997 | Dennison et al. ......... 156/636.1 |
| 5,652,182 A | 7/1997 | Cleeves ....................... 437/195 |
| 5,659,201 A | 8/1997 | Wollesen .................... 257/758 |
| 5,663,102 A | 9/1997 | Park ............................ 438/626 |
| 5,679,608 A | 10/1997 | Cheung et al. ............. 437/195 |
| 5,686,354 A | 11/1997 | Avanzino et al. ........... 437/190 |
| 5,689,140 A | 11/1997 | Shoda ......................... 257/774 |
| 5,691,238 A | 11/1997 | Avanzino et al. ........... 437/195 |
| 5,913,148 A | 6/1999 | Hills ........................... 438/701 |
| 6,008,121 A | 12/1999 | Yang et al. .................. 438/637 |
| 6,037,207 A | 3/2000 | Asano et al. ................ 438/241 |
| 6,403,483 B1 | 6/2002 | Hao et al. | |
| 6,461,963 B1 | * 10/2002 | Givens et al. .............. 438/692 |

* cited by examiner

Primary Examiner—Benjamin L. Utech
Assistant Examiner—Duy-Vu Deo
(74) Attorney, Agent, or Firm—TraskBritt

(57) ABSTRACT

A method of forming structures in semiconductor devices through a buffer or insulator layer comprises the use of a silicon hard mask between a patterned resist layer for etching the structures and an underlying barrier layer. The silicon hard mask acts as a backup to the resist layer, preventing the potential etching of the barrier layer which is protected by the resist layer by acting as an etch stop if the first resist layer is ablated away during the etching of the openings for the structures. After etching, a layer of silicidable material is deposited over the silicon hard mask and the resulting structure is annealed to turn the silicon hard mask into a silicide material. The silicide material is removed by an abrasive method, such as by CMP.

18 Claims, 12 Drawing Sheets

METHODS FOR UTILIZATION OF DISAPPEARING SILICON HARD MASK FOR FABRICATION OF SEMICONDUCTOR STRUCTURES

CROSS-REFERENCE TO RELATED APPLICATION

This application is a continuation of application Ser. No. 09/651,462, filed Aug. 30, 2000, now U.S. Pat. No. 6,461,963, issued Oct. 8, 2002.

BACKGROUND OF THE INVENTION

1. Field of the Invention

The present invention relates to the formation of contacts and runners in semiconductor devices. More particularly, the present invention relates to a dual damascene metallization method used in the formation of semiconductor devices utilizing a silicon hard mask to minimize thickness of resist material required to form contacts and runners in the semiconductor devices.

2. State of the Art

Two exemplary methods of fabricating contacts and runners for integrated circuits are damascene and dual damascene techniques. The damascene technique is an interconnection fabrication process in which runner trenches are formed in an insulating or dielectric layer of a semiconductor device. The runner trenches are then filled with metal or other conductive material to form conductive lines, known as "runners." The dual damascene technique is a multilevel interconnection fabrication process in which, in addition to forming runner trenches, contact openings are formed in the insulating or dielectric layer of the semiconductor device. The runner trenches and the contact openings are then simultaneously filled with conductive material to form both the runners and contacts.

An exemplary dual damascene technique for forming a memory cell includes providing an intermediate structure including a substrate having active areas electrically isolated by field oxide areas. The isolated active areas have drain regions and source regions doped into the substrate. Transistor gate members are formed on the surface of the substrate, include gate members residing on substrate active areas spanned between the drain regions and the source regions, and further include gate members residing on the thick field oxide. An insulating layer covers the transistor gate members and the substrate. The insulating layer is patterned with a first resist material such that the patterned first resist material has a plurality of openings located in desired positions for forming contact openings. The insulating layer is then anisotropically etched through the openings in the first resist material to expose the source regions and the drain regions in the underlying substrate. The first resist material is then removed and the insulating layer is coated with a second resist material which is patterned with the image pattern of the desired runners in alignment with the contact openings. The insulating layer is anisotropically etched to form runner trenches in an upper portion of the insulating material. After the runner trench etching is complete, both the contact openings and runner trenches are filled with metal or other conductive material, thereby forming the contacts and the runners. The dual damascene technique is an improvement over the single damascene technique because the dual damascene fills both the contact openings and the runner trenches with conductive material at the same time, thereby eliminating process steps for filling the contact openings and runner trenches separately. The dual damascene technique may also be used for forming multilevel signal lines in the insulating layers of a multilayer substrate on which various semiconductor devices reside.

Higher performance, lower cost, increased miniaturization of components, and greater packaging density of integrated circuits are ongoing goals of the computer industry. The advantages of increased miniaturization of components include: reduced-bulk electronic equipment, improved reliability by reducing the number of solder or plug connections, lower assembly and packaging costs, and improved circuit performance. However, as components become smaller and smaller, tolerances for all semiconductor structures (such as circuitry runners, contacts, and the like) become more and more stringent. Although the reduction in size creates technical problems, the future advancement of the technology requires the capability for forming sub-0.35 µm contact openings with aspect ratios (height to width) as high as 10 to 1.

An exemplary technique employed in forming high aspect ratio structures is MERIE (magnetically enhanced reactive ion etch). For example, if a 3 micron (30 kÅ) deep contact opening in an insulating layer, such as BPSG (borophosphosilicate glass), is desired, a layer of resist material having a thickness of at least about 11 kÅ to 14 kÅ is necessary. Such a thickness of resist material is required because as the insulating layer is etched in the MERIE system, the resist material is also ablated away. Thus, the resist material must be thick enough not to ablate completely away during the etching of the contact opening in the insulating layer. If the resist material is ablated away, the MERIE will damage (i.e., etch) the top surface of the insulating layer. Unfortunately, the thicker the resist material, the more difficult it is to form contact openings. More specifically, the depth of focus is reduced as resist thicknesses increase, therefore reducing the reproducible resolution obtainable in the photolithography step. Thus, the best pattern resolution is obtained with thinner photoresists. If the patterned images (e.g., by lithography) are not well defined (which occurs with a thick resist layer), the etching of the contact opening in the insulating layer slows down or stops before reaching the substrate. Thus, no contact can be made with the source or drain regions on the substrate. In order to insure complete etching of the contact opening, the thickness of the resist material can be reduced (for example down to about 8 kÅ to 10 kÅ) or the chemistry (chemicals used in the MERIE system) can be changed to run with a specific chemistry that results in less polymerizing (i.e., less polymer-rich chemistry which means a lower resist material selectivity). The "lower" polymerizing etches generally can etch deeper for a given contact size than "higher" polymerizing etches, which tend to form more sidewall polymer, eventually sealing the contact shut during the etch. With either option, the resist material will likely be ablated away before completion of the etching of the contact opening in the insulating material. Another option is to increase the diameter of the contact opening. However, this would decrease the aspect ratio which is, of course, counter to the goal of semiconductor miniaturization.

Therefore, it would be advantageous to develop a technique for forming high aspect contacts for semiconductor devices which minimizes the thickness of resist material required in the formation of the same, while using inexpensive, commercially available, widely practiced semiconductor device fabrication techniques and equipment without requiring complex processing steps.

BRIEF SUMMARY OF THE INVENTION

The present invention relates to forming a silicon hard mask to act as a potential etch stop between a patterned resist layer and a buffer or insulator layer in the fabrication of structures, such as contacts, for semiconductor devices. The present invention may also be used in a dual damascene metallization method in the formation of contacts and runners in semiconductor devices.

The most fundamental method aspect of the present invention involves forming a contact in a barrier layer which covers an active element (such as a conductive material or metal trace, source region or a drain region doped in a silicon substrate, or the like) of a semiconductor device. A silicon hard mask, such as an amorphous silicon ("a-Si") or polymeric silicon ("poly-Si") layer, is deposited over the barrier layer. A resist layer is then patterned on the silicon hard mask. The silicon hard mask and barrier layer are etched to form a contact opening. The silicon hard mask acts as a backup to the resist layer. The silicon hard mask prevents the potential etching of the barrier layer, which is protected by the first resist layer, by acting as an etch stop if the first resist layer is ablated away during the etching of the contact openings. If such a silicon hard mask is not used, the resist layer must be thicker in order to ensure that the resist layer is not ablated away during the etching of the contact openings. However, as noted previously, if the resist layer is too thick, the etching of the contact opening in the barrier layer slows down or stops before reaching the substrate. Thus, no contact can be made with the active element.

Any remaining resist layer is stripped, and a layer of silicidable metal and, optionally, a barrier film are deposited respectively over the etched structure to form a layered structure. The layered structure is then annealed to form a mask silicide layer by the reaction of the silicidable metal with the silicon hard mask. The mask silicide layer is much more conducive to abrasive removal, such as by chemical mechanical planarization (CMP), than a hard silicon mask.

Additionally, if the contact opening is formed to a silicon-containing substrate, the annealing forms contact silicide layers in the bottoms of the contact openings by the reaction of the silicidable metal with the silicon of the substrate. The contact silicide layers are generally formed to reduce the contact resistance at the interface between the conductive material to be subsequently deposited in the contact openings and semiconductor device drain regions and the source regions formed in the substrate material.

A conductive material is deposited to fill the contact openings and an upper portion of the conductive material and the mask silicide layer are removed, preferably using an abrasive process, such as CMP, to form the contact. It is, of course, understood that the mask silicide layer can optionally be removed prior to filling the contact openings with conductive material.

Another method of the present invention is practiced after the formation of an intermediate structure comprising transistor gates on a silicon substrate which has been oxidized to form thick field oxide areas to electrically isolate active areas on the silicon substrate and which has been exposed to implantation processes to form drain and source regions. The intermediate structure further comprises at least one barrier layer which covers the transistor gates and the silicon substrate. An etch stop layer is formed over the barrier layer and a dielectric layer is formed over the etch stop layer. A silicon hard mask, such as an amorphous silicon ("a-Si") or polymeric silicon ("poly-Si") layer, is deposited over the dielectric layer. A first resist layer is patterned on the silicon hard mask and the silicon hard mask is etched to form intermediate contact openings. The dielectric layer, the etch stop layer, and the barrier layer are then etched through intermediate contact openings to expose the drain regions and/or the source regions and form contact openings.

Again, the silicon hard mask acts as a backup to the first resist layer. The silicon hard mask prevents the potential etching of the dielectric layer, the etch stop layer, and the barrier layer (which is protected by the first resist layer) by acting as an etch stop if the first resist layer is ablated away during the etching of the contact openings. As discussed above, if such a silicon hard mask is not used, the first resist layer must be thicker in order to ensure that the first resist layer is not ablated away during the etching of the contact openings. However, if the first resist layer is too thick, the etching of the contact opening slows down or stops before reaching the substrate. Thus, no contact can be made with the source or drain regions on the substrate.

If the silicon hard mask technique of the present invention is used in a dual damascene method, runners are formed after the contact opening is formed. First, any remaining first resist layer is stripped and a second resist layer is patterned on the silicon hard mask in a pattern of desired runners. A portion of the second resist layer deposits in the contact openings to cover and protect the drain regions and the source regions. The silicon hard mask is etched to form intermediate runner trenches. The dielectric layer and the etch stop layer are then etched to form runner trenches. Any remaining second resist layer is then stripped to form an etched structure. A layer of silicidable metal and a barrier film are deposited respectively over the etched structure to form a layered structure.

The layered structure is then annealed to form contact silicide layers in the bottom of the contact openings by the reaction of the silicidable metal with the silicon in drain regions and source regions. Additionally, the annealing forms a mask silicide layer by the reaction of the silicidable metal with the silicon hard mask. The mask silicide layer is much more conducive to abrasive removal, such as by CMP, than a hard silicon mask.

A conductive material is deposited to fill the contact openings and the runner trenches (if a dual damascene method is used). An upper portion of the conductive material and the mask silicide layer are removed. The removal of the upper portion of the conductive material and the mask silicide layer effectuates the separation of the conductive material within the contact openings and the runner trenches to form capacitor contacts (in electrical communication with the drain regions), bitline contacts (in electrical communication with the source regions), and/or runners (if a dual damascene method is used).

The use of the silicon hard mask of the present invention results in a substantial reduction of the required thickness of the resist material. For the etching of a 30 kÅ deep contact opening, the thickness of the resist material layer may be reduced from between about 11 kÅ and 14 kÅ to between about 7 kÅ and 9 kÅ. For the etching of a 5 kÅ deep runner trench, the thickness of the required resist material layer may be reduced from between about 5 kÅ and 7 kÅ to between about 2 kÅ and 3 kÅ.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

FIGS. 1–8 illustrate a technique for forming contacts for a semiconductor device according to the invention. It should be understood that the figures presented in conjunction with this description are not meant to be illustrative of actual cross-sectional views of any particular portion of an actual semiconductor device, but are merely idealized representations which are employed to more clearly and fully depict the process of the invention than would otherwise be possible.

Figure 1:
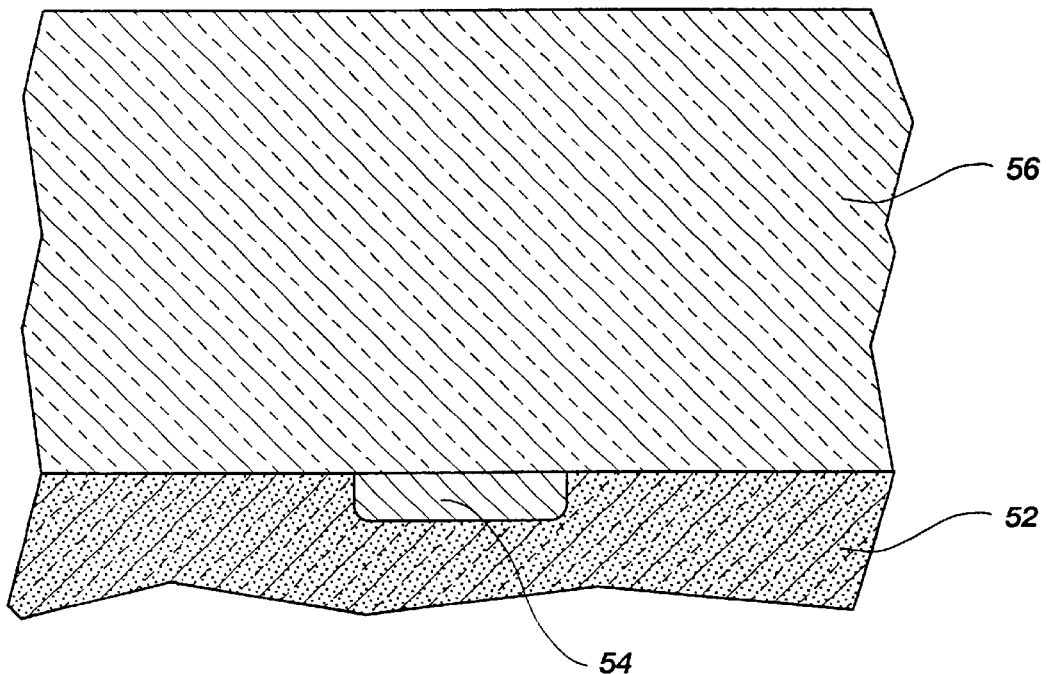
FIG. 1 is a side cross-sectional view of a substrate having an active element and a barrier layer disposed over the substrate according to the present invention.
Figure 2:
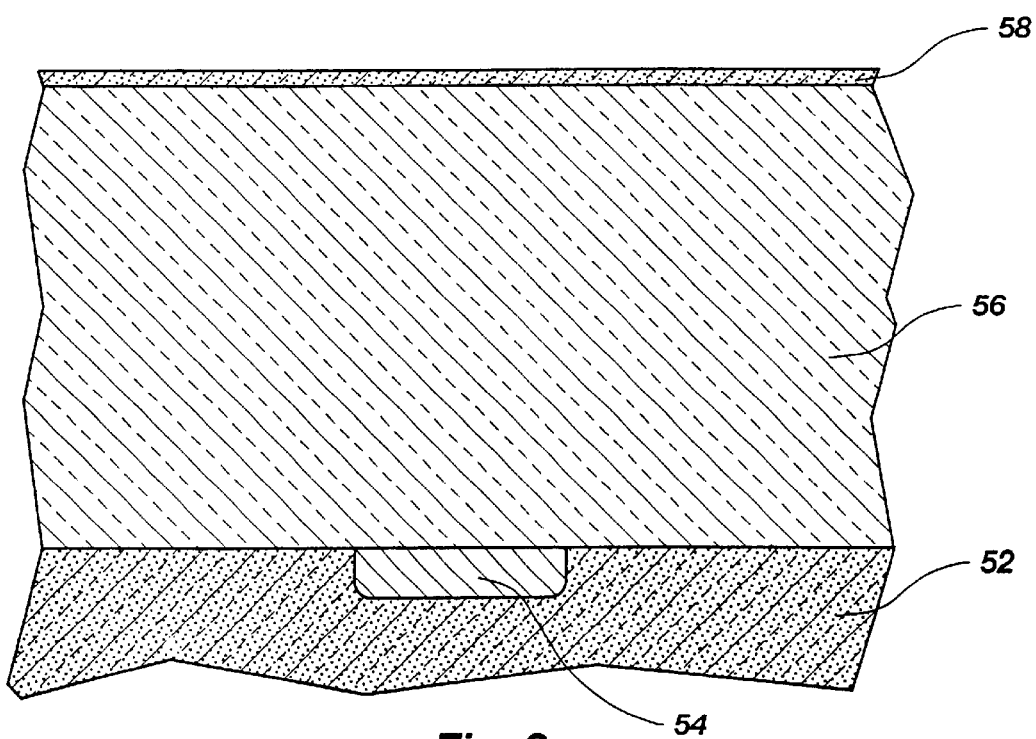
FIG. 2 is a side cross-sectional view of a silicon hard mask deposited over the barrier layer according to the present invention.
Figure 3:
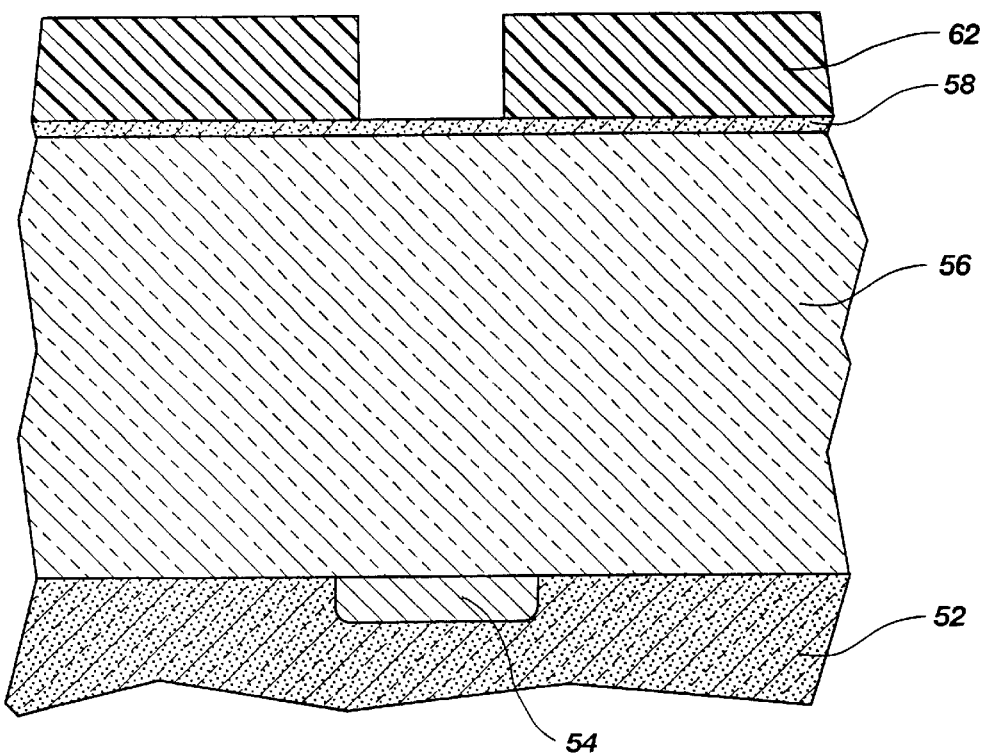
FIG. 3 is a side cross-sectional view of a resist layer patterned on the silicon hard mask according to the present invention.
Figure 4:
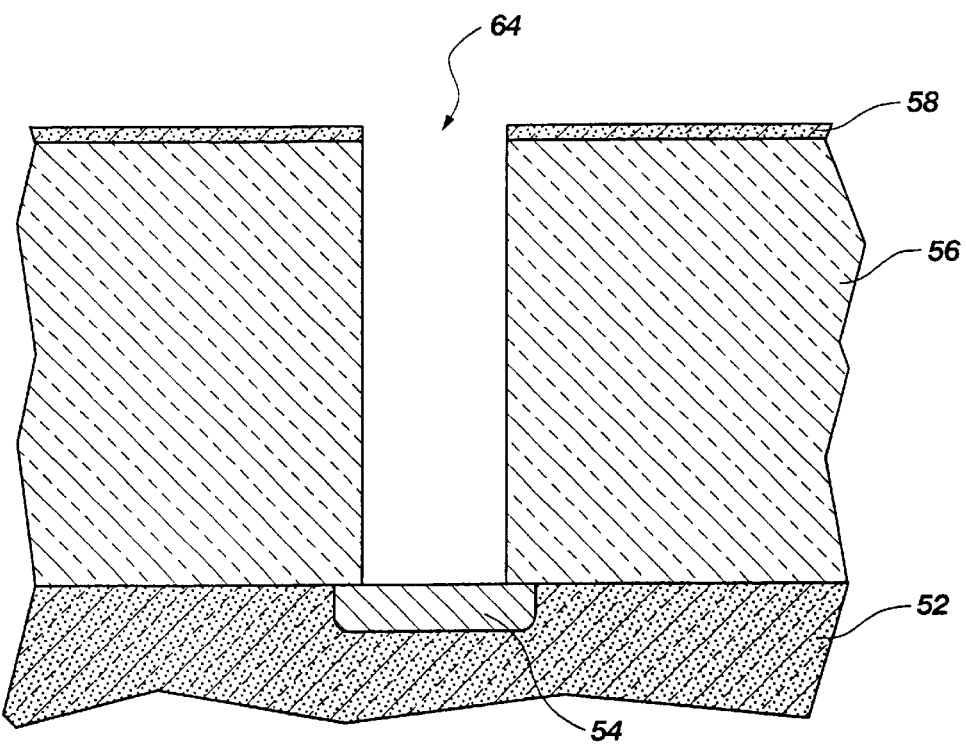
FIG. 4 is a side cross-sectional view of the silicon hard mask and the barrier layer etched to form a contact opening according to the present invention.
Figure 5:
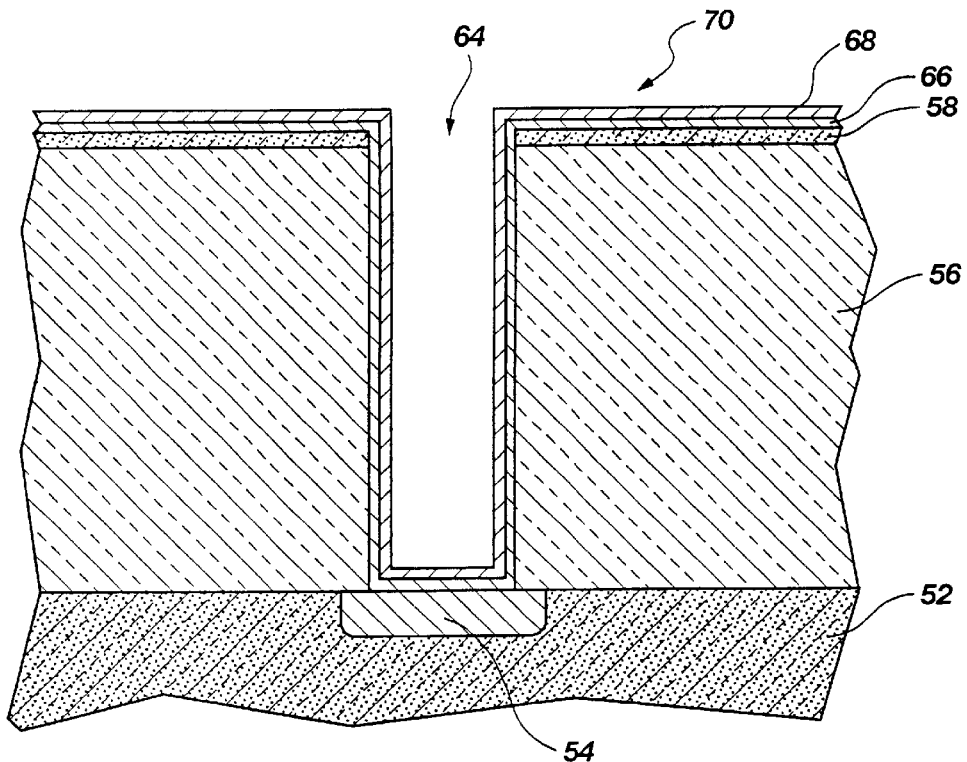
FIG. 5 is a side cross-sectional view of a layer of silicidable metal and a barrier film deposited respectively over the barrier layer and in the contact opening to form a layered structure according to the present invention.
Figure 6:
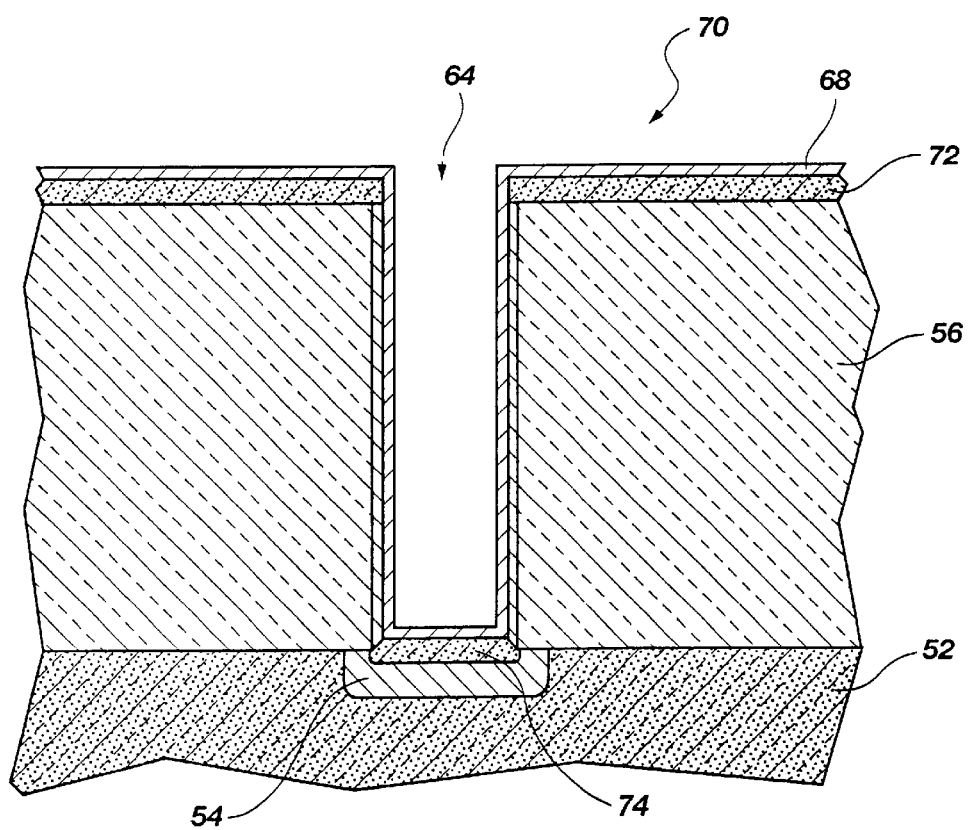
FIG. 6 is a side cross-sectional view of the layered structure after annealing according to the present invention.

FIG. 1 illustrates a cross-sectional view of a substrate 52, preferably a silicon-containing substrate, having active element 54 and a barrier layer 56 (such as borophosphosilicate glass—BPSG, phosphosilicate glass—PSG, borosilicate glass—BSG, or the like) disposed over the substrate 52. It is, of course, understood that the active element 54 can include conductive material or metal traces, active regions doped in a silicon-containing substrate (illustrated), or the like. A silicon hard mask 58, such as an amorphous silicon ("a-Si") or polymeric silicon ("poly-Si") layer, is deposited over the barrier layer 56, as shown in FIG. 2. A resist layer 62 is then applied and patterned on the silicon hard mask 58, as shown in FIG. 3. The silicon hard mask 58 and the barrier layer 56 are etched to form a contact opening 64, as shown in FIG. 4. Any remaining resist layer is stripped, and a layer of silicidable metal 66 (such as titanium, cobalt, and the like) and, optionally, a barrier film 68 (such as titanium nitride) are deposited respectively over the barrier layer 56 and into the contact opening 64 to form a layered structure 70, as shown in FIG. 5. The layered structure 70 is then annealed to form a mask silicide layer 72 by the reaction of the silicidable metal 66 with the adjacent silicon hard mask 58, as shown in FIG. 6. The mask suicide layer 72 is much more conducive to abrasive removal, such as by CMP, than a silicon hard mask.

As also illustrated in FIG. 6, when the contact opening 64 is formed in a silicon-containing substrate, the annealing forms contact silicide layer 74 in the bottom of the contact opening 64 by the reaction of the silicidable metal 66 with the silicon of the substrate. The contact silicide layer 74 is generally formed to reduce the contact resistance at the interface between the conductive material to be subsequently deposited in the contact openings and active regions of a semiconductor device.

Figure 7:
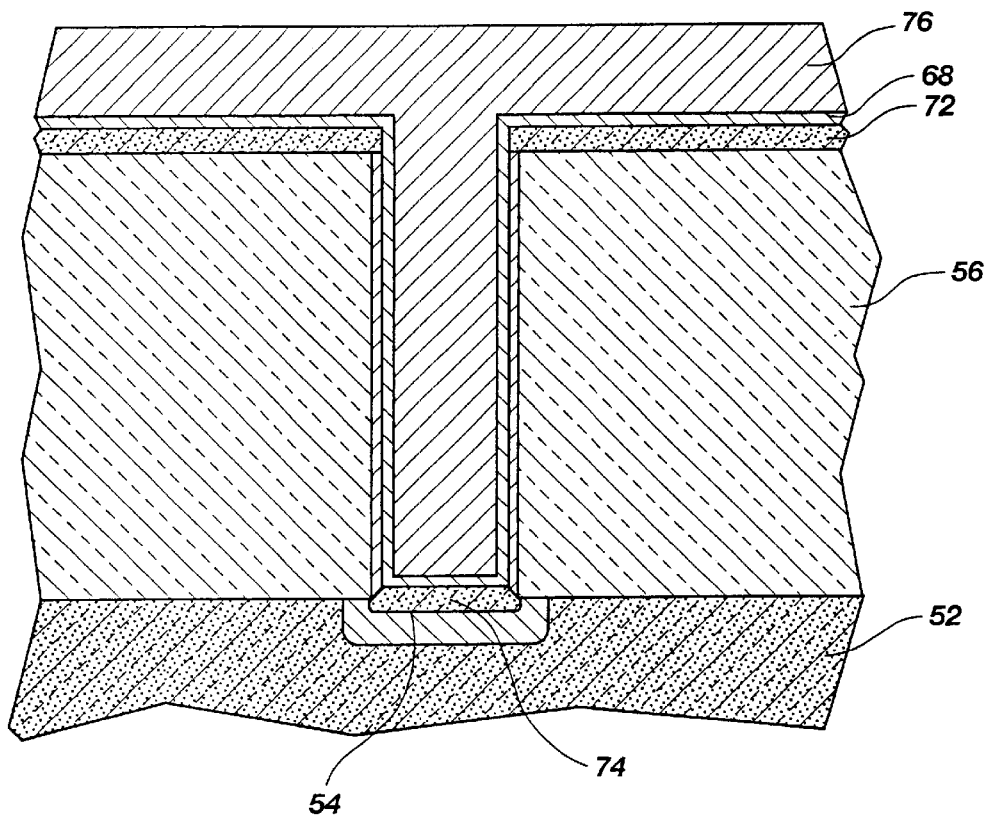
FIG. 7 is a side cross-sectional view of a conductive material deposited over the barrier layer to fill the contact opening according to the present invention.
Figure 8:
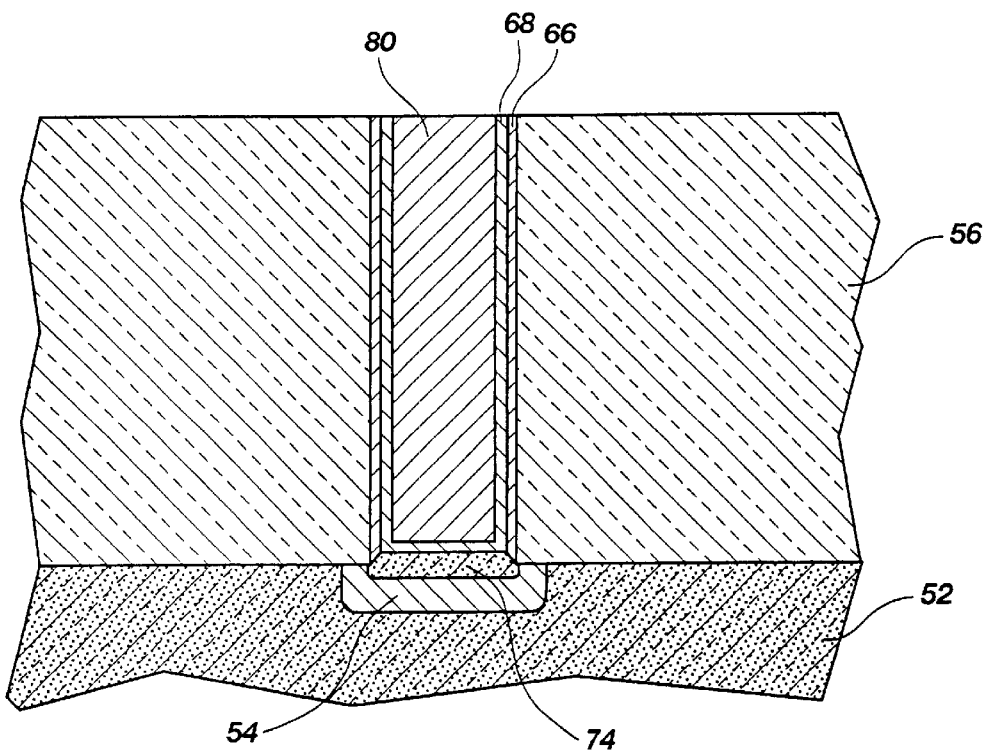
FIG. 8 is a side cross-sectional view of an upper portion of the conductive material and the mask silicide layer removed to form a contact according to the present invention.

A conductive material 76 is deposited over the barrier layer 56 to fill the contact opening 64, as shown in FIG. 7, and an upper portion of the conductive material 76 and the mask silicide layer 72 are removed, preferably using an abrasive process, such as chemical mechanical planarization (CMP) to form the contact 80, as shown in FIG. 8. It is, of course, understood that the mask silicide layer can be removed prior to filling the contact openings with conductive material.

FIGS. 9–23 illustrate a dual damascene technique according to this invention for forming contacts and runners for a memory cell. An array of memory cells is used to produce DRAM (Dynamic Random Access Memory) semiconductor chips.

Figure 9:
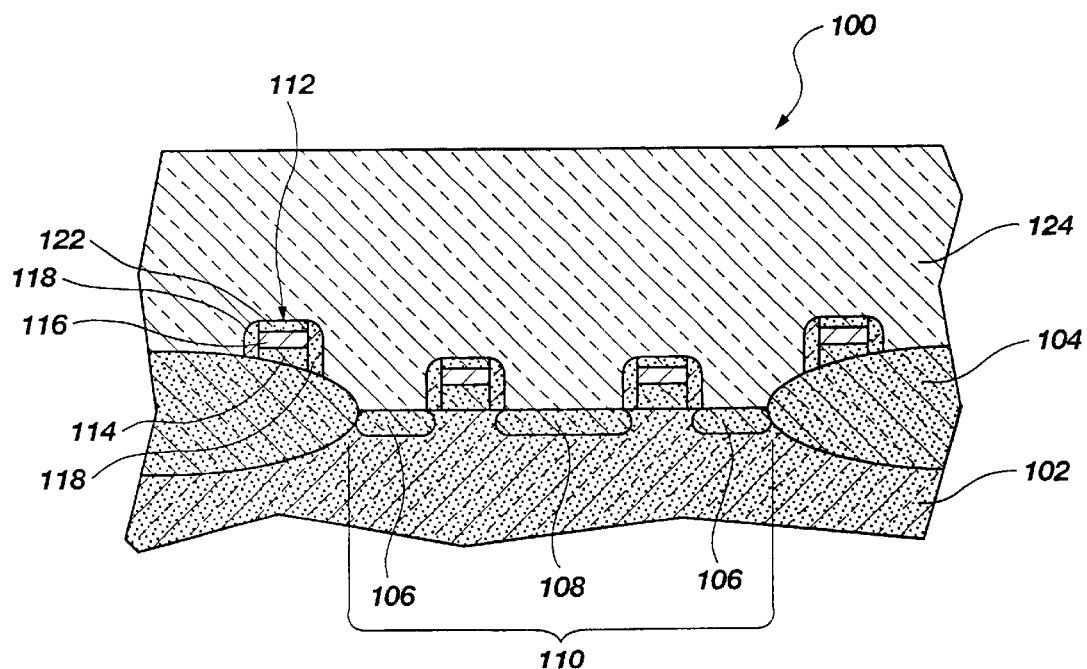
FIG. 9 is a side cross-sectional view of an in-process intermediate structure in the production of the memory cell array according to the present invention.

FIG. 9 illustrates a cross-sectional view of an in-process intermediate structure 100 in the production of the memory cell array (i.e., a DRAM semiconductor chip). This intermediate structure 100 comprises a substrate 102, such as a lightly doped P-type silicon substrate, which has been oxidized to form thick field oxide areas 104 which electrically isolate active areas 110 and exposed to implantation processes to form drain regions 106 and source regions 108 of N+ doping in the active areas 110. Transistor gate members 112 are formed on the surface of the substrate 102, including transistor gate members 112 residing on a substrate active area 110 spanned between the drain regions 106 and the source regions 108, and transistor gate members 112 residing on the thick field oxide areas 104. The transistor gate members 112 each comprise a lower buffer layer 114, preferably made of silicon dioxide, separating a gate conducting layer or wordline 116 of the transistor gate member 112 from the substrate 102. Transistor insulating spacer members 118, preferably made of silicon nitride, are formed on either side of each transistor gate member 112. A cap insulator 122, also preferably made of silicon nitride, is formed on the top of each transistor gate member 112.

A barrier layer 124 (preferably made of borophosphosilicate glass—BPSG, phosphosilicate glass—PSG, borosilicate glass—BSG, or the like; most preferably made of BPSG with a thickness greater or equal to 20 kÅ) is applied over the transistor gate members 112 and the substrate 102. The barrier layer 124 may be optionally planarized, if necessary, preferably using an abrasive process, such as chemical mechanical planarization ("CMP").

It is, of course, understood that a second barrier layer, such as tetraethyl orthosilicate—TEOS, or silicon nitride, or combinations thereof, may be employed between the barrier layer 124 and the transistor gate members 112 and the substrate 102 to prevent dopant migration. Materials such as BPSG, BSG, and PSG, of course, contain boron and/or phosphorus which can migrate into the drain regions 106 and the source regions 108 during inherent device fabrication heating steps. The migration of boron and phosphorus can change the dopant concentrations in the drain regions 106 and the source regions 108 which can adversely affect the transistor performance.

Figure 10:
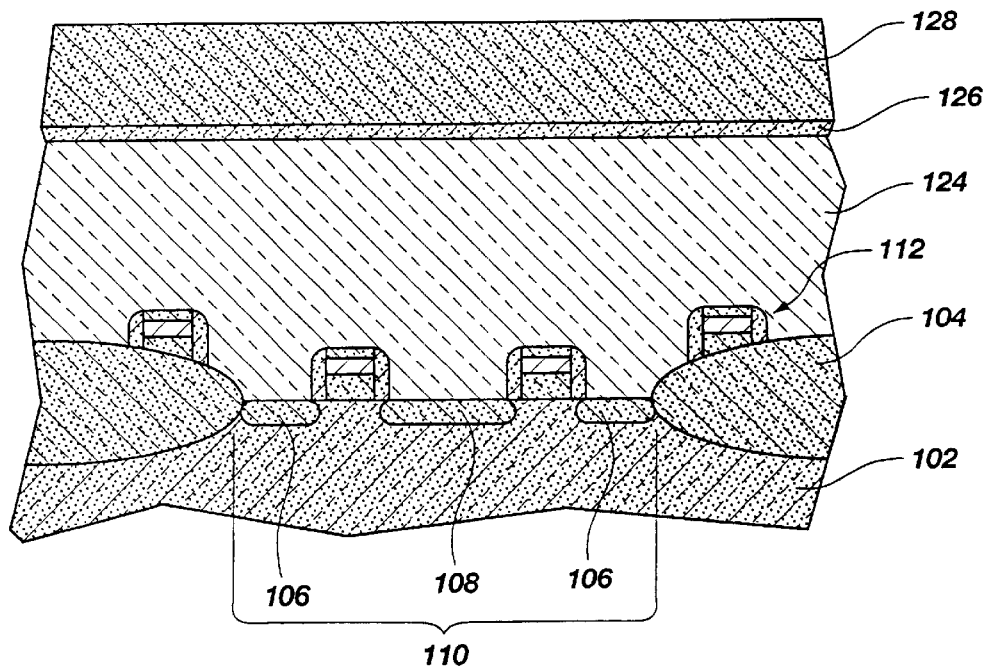
FIG. 10 is a side cross-sectional view of an etch stop layer over the in-process intermediate structure of FIG. 9 and a dielectric layer deposited over the etch stop layer according to the present invention.
Figure 11:
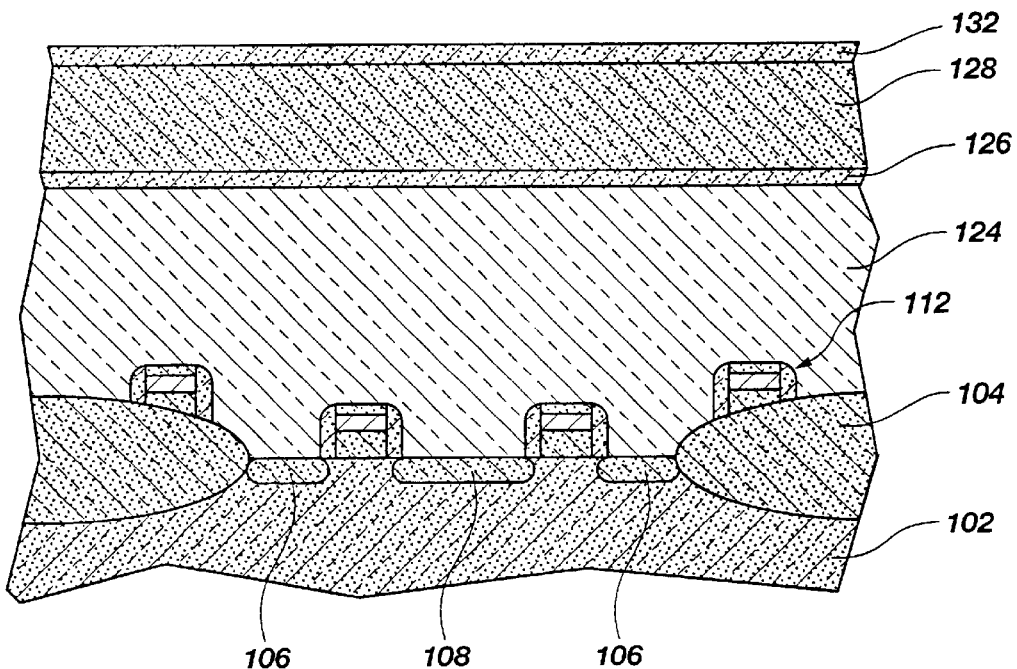
FIG. 11 is a side cross-sectional view of a silicon hard mask deposited over the dielectric layer according to the present invention.

An etch stop layer 126, preferably silicon nitride deposited by plasma-enhanced chemical vapor deposition ("PECVD") to a thickness of between about 250 Å and 1000 Å, is deposited over the barrier layer 124, and a dielectric layer 128, preferably TEOS to a thickness of between about 5 kÅ and 10 kÅ, is deposited over the etch stop layer 126, as shown in FIG. 10. A silicon hard mask 132, preferably an amorphous silicon ("a-Si") or polymeric silicon ("poly-Si") layer about 500 Å thick, is deposited over the dielectric layer 128, as shown in FIG. 11.

Figure 12:
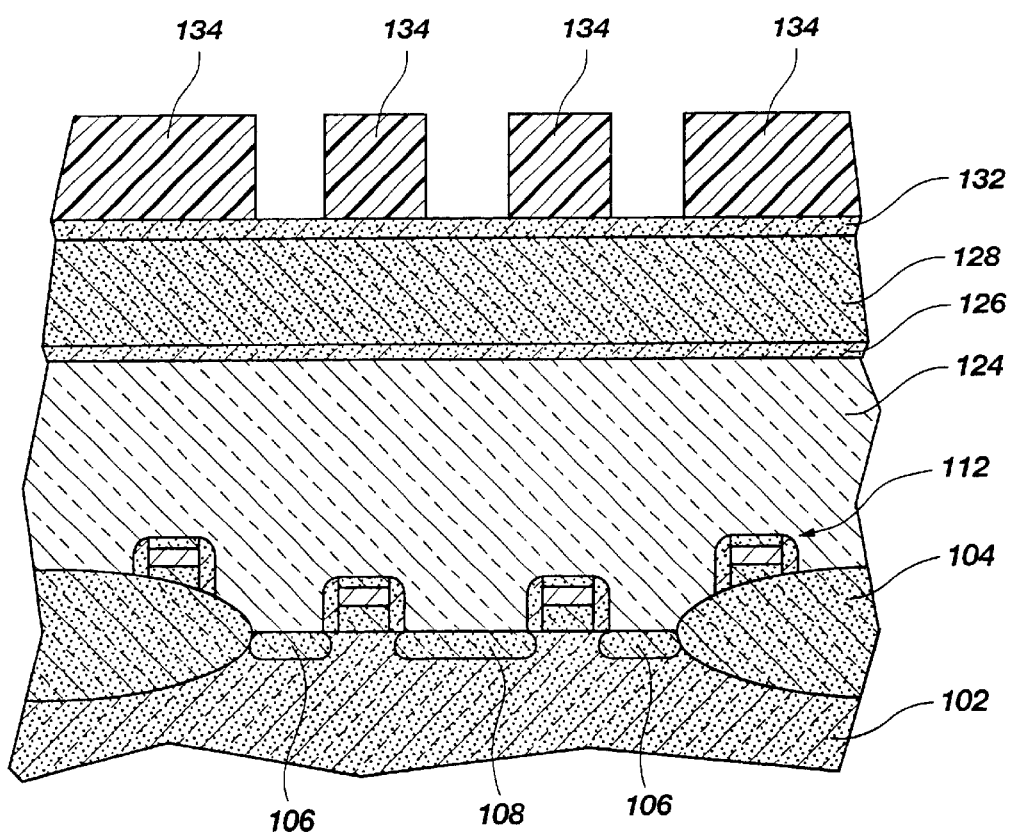
FIG. 12 is a side cross-sectional view of a first resist layer patterned on the silicon hard mask according to the present invention.
Figure 13:
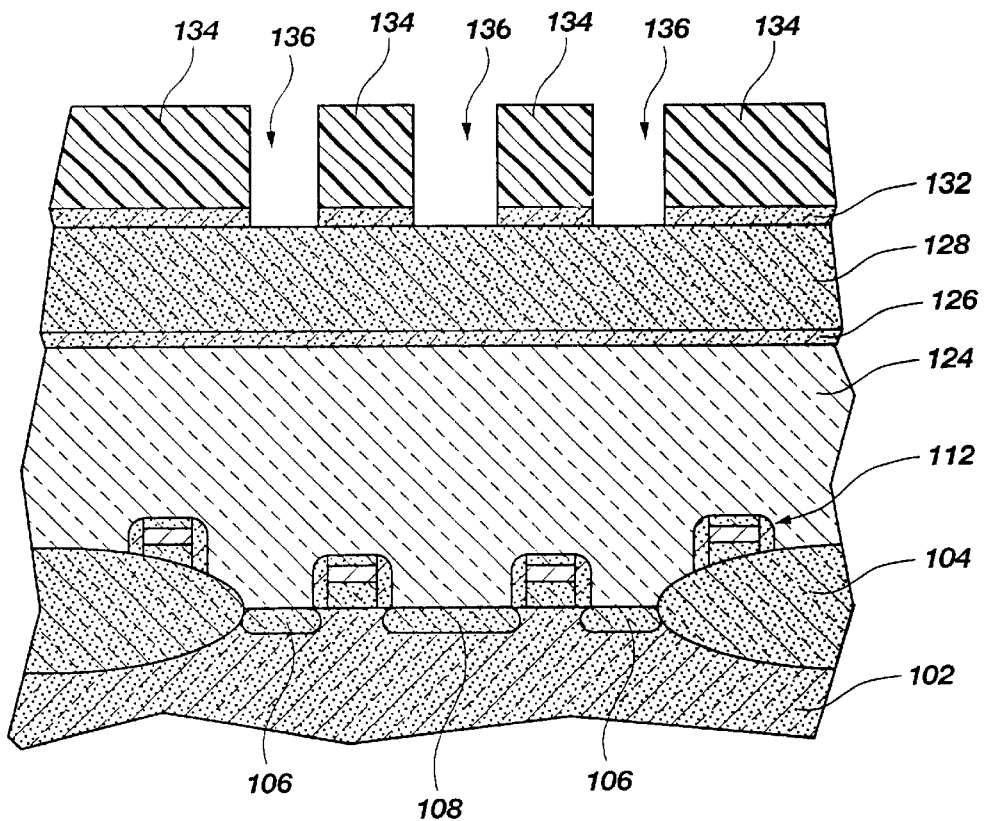
FIG. 13 is a side cross-sectional view of the silicon hard mask etched to form intermediate contact openings according to the present invention.
Figure 14:
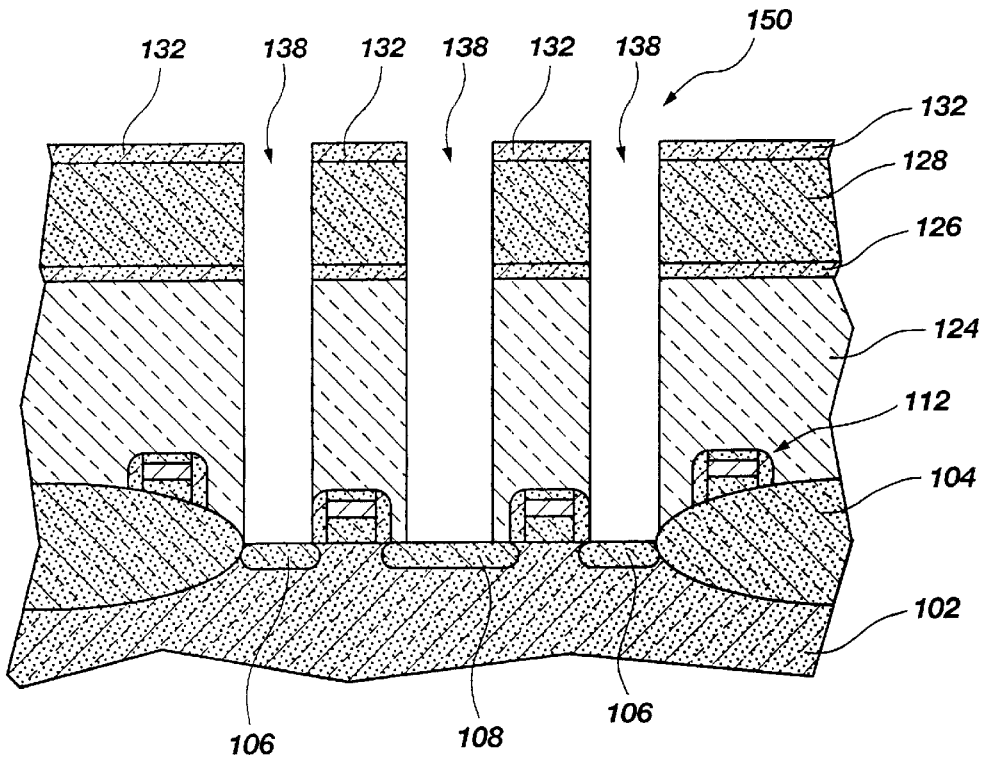
FIG. 14 is a side cross-sectional view of the dielectric layer, the etch stop layer, and the barrier layer etched through the intermediate contact openings to expose drain regions and source regions and form contact openings according to the present invention.

A first resist layer 134 is patterned on the silicon hard mask 132, as shown in FIG. 12. For etching a 30 kÅ contact opening, a first resist layer thickness of between about 7 kÅ and 9 kÅ is required. The silicon hard mask 132 is etched, preferably by using an etch selective to resist layer 134 and, alternatively, also to the barrier layer 124. Representative chemistries include those obtained with HBr/Cl$_2$ chemistries. Etching of the silicon hard mask 132 forms intermediate contact openings 136, as shown in FIG. 13. The dielectric layer 128, the etch stop layer 126, and the barrier layer 124 are then etched, preferably by MERIE, through intermediate contact openings 136 to expose the drain regions 106 and the source regions 108 and form contact openings 138, as shown in FIG. 14.

The silicon hard mask 132 acts as a back-up to the first resist layer 134. The silicon hard mask 132 prevents the potential etching of the dielectric layer 128, the etch stop layer 126, and the barrier layer 124 which is protected by the first resist layer 134, if the first resist layer 134 is ablated away during the etching of the contact openings 138. The silicon hard mask 132 achieves this because it acts as an etch stop if the first resist layer 134 is ablated away. If the silicon hard mask 132 is not used, the first resist layer 134 must be thicker in order to ensure that the first resist layer 134 is not etched away during the etching of the contact openings 138. However, if the first resist layer 134 is too thick, the etching of the contact opening will slow down or stop before reaching the substrate. The taller resist increases the height to width ratio of the contact, which generally causes sidewall polymer formation that prematurely terminates the etch. Thus, no contact can be made with the source or drain regions 106, 108 on the substrate. In order to insure complete etching of the contact opening, the thickness of the resist material may be reduced (for example: down to about 7 kÅ to 10 kÅ) or the chemistry (chemicals used in the MERIE system) can be changed to run "leaner" (i.e., less polymer rich chemistry which means a lower resist material selectivity). With either option, the resist material will likely be ablated away before completion of the etching of the contact opening in the insulating material. Another option is to increase the diameter of the contact opening. However, this would decrease the aspect ratio which is, of course, counter to the goal of increased miniaturization of components and greater packaging density of integrated circuits. Thus, the use of silicon hard mask 132 allows for a thinner first resist layer 134 which ultimately assists in keeping the semiconductor device size small.

Figure 15:
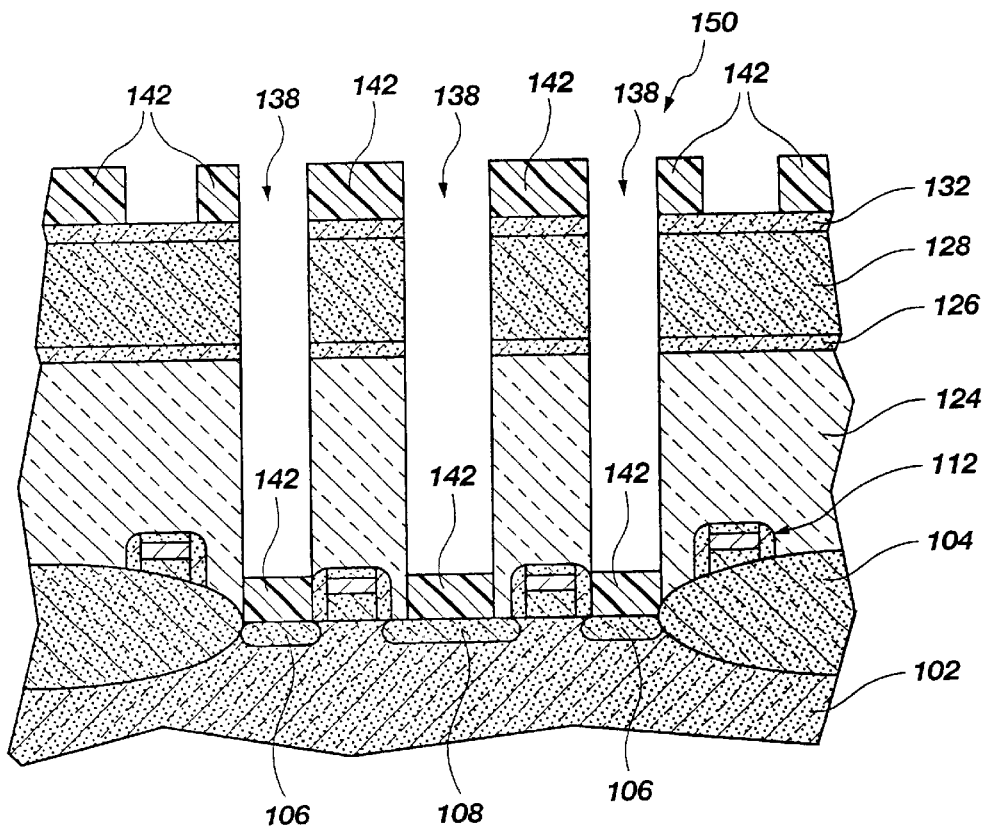
FIG. 15 is a side cross-sectional view of a second resist layer patterned on the silicon hard mask according to the present invention.
Figure 16:
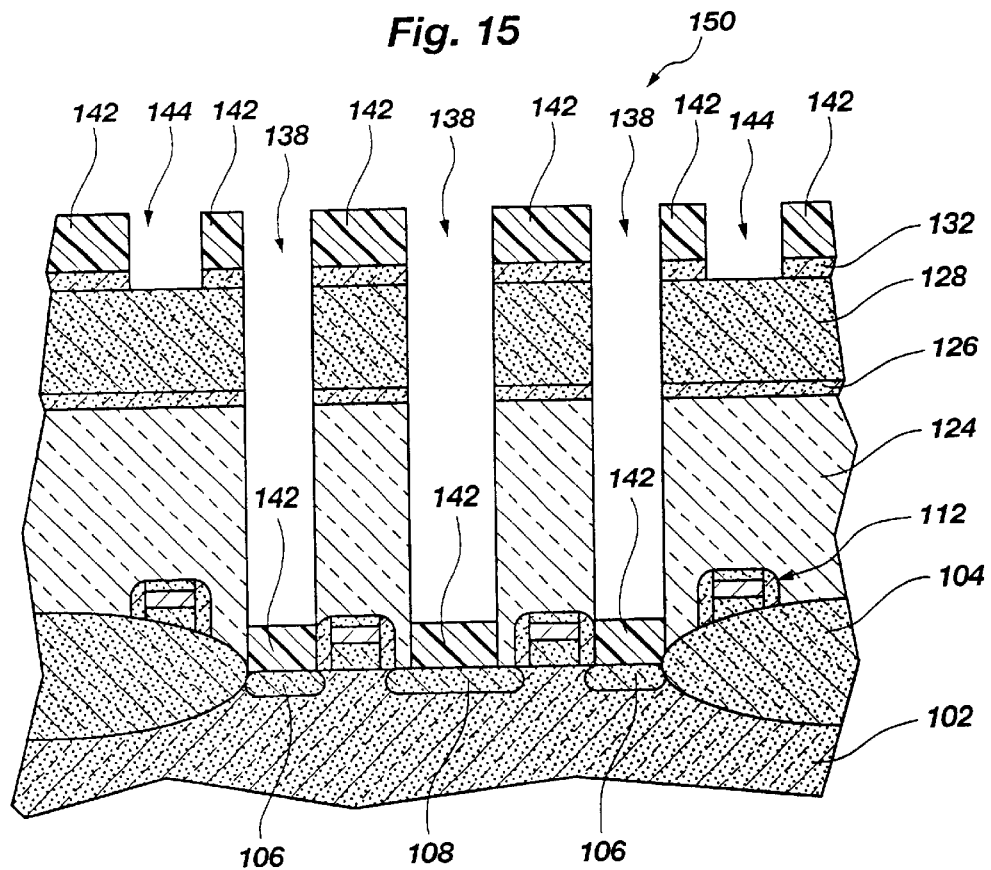
FIG. 16 is a side cross-sectional view of the silicon hard mask etched to form intermediate runner trenches according to the present invention.
Figure 17:
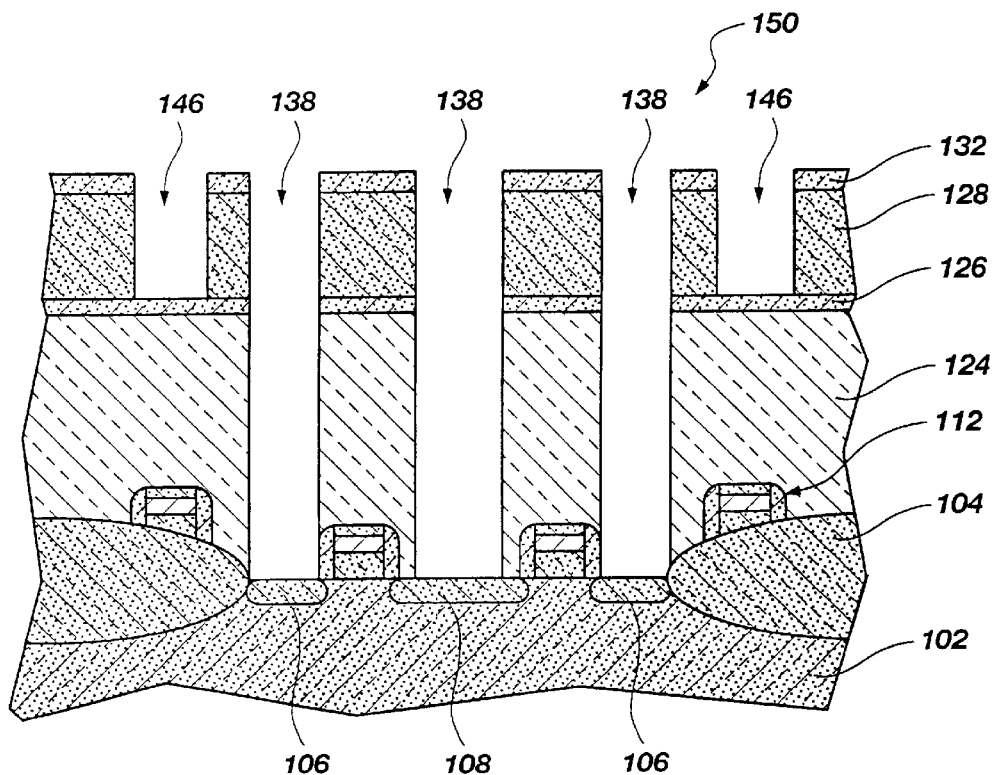
FIG. 17 is a side cross-sectional view of the dielectric layer and the etch stop layer etched to form runner trenches according to the present invention.

The remaining resist material of the first resist layer 134 may then be stripped, such as with a low-pressure plasma technique (e.g., a partial dry etch or an ashing technique), or the like. A second resist layer 142 is patterned on the silicon hard mask 132, as shown in FIG. 15. For subsequently etching a 5 kÅ runner trench, a resist layer thickness of between about 2 kÅ and 3 kÅ is required. A portion of the second resist layer 142 also deposits in the contact openings 138 to cover and protect the drain regions 106 and the source regions 108. As an example, the first resist layer 134 may be formed by depositing 600 Å of JSR DUV-42P BARC organic antireflective coating followed by 8300 Å to 9800 Å JSR M15G photoresist. As an example, the second resist layer 142 can be formed by depositing 1200 Å Brewer EXP00024B BARC antireflective coating followed by 8500 Å Shin-Etsu SEPR-402 photoresist. The silicon hard mask 132 is etched, preferably with an etch that has excellent selectivity to photoresist and the barrier layer 124, such as etch processes that use HBr/Cl$_2$ mixtures, to form intermediate runner trenches 144, as shown in FIG. 16. The dielectric layer 128 is then etched, preferably by MERIE, as shown in FIG. 17, to form runner trenches 146 and thereby forming an etched structure 150 (first seen in FIG. 14). The runner trenches 146 will run substantially transverse to the plane of the cross-sectional view shown in FIG. 17.

Figure 18:
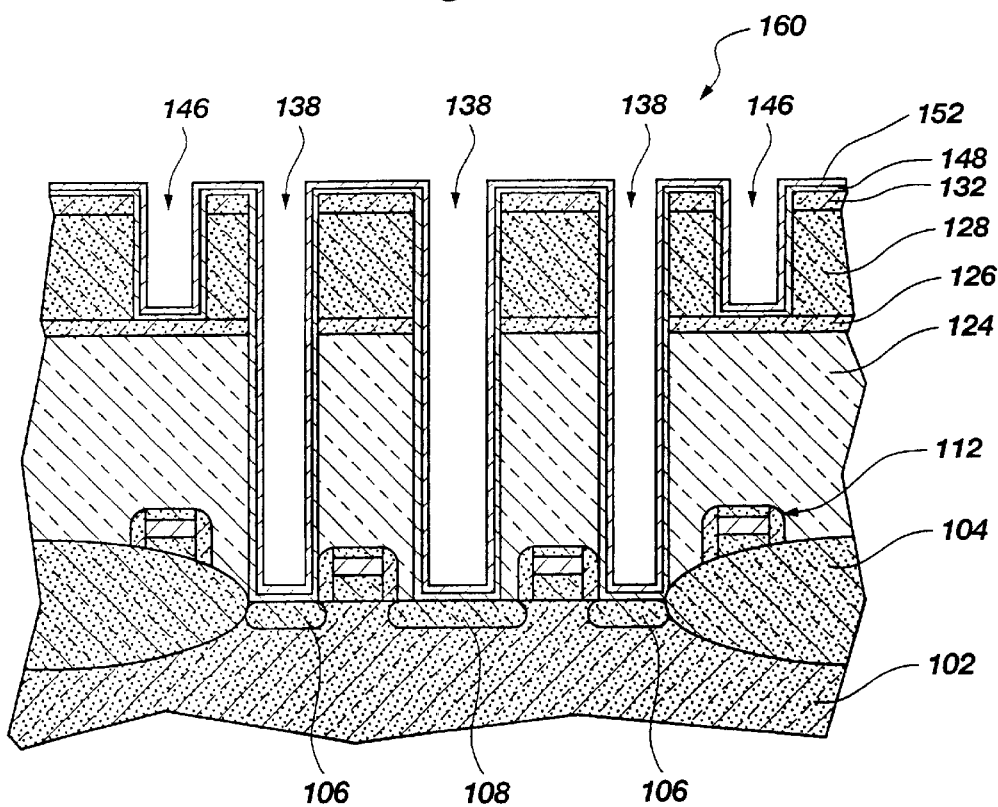
FIG. 18 is a side cross-sectional view of a layer of silicidable metal and a barrier film deposited respectively over the etched structure to form a layered structure according to the present invention.

The remaining resist material of the second resist layer 142 may then be stripped, such as with a low-pressure plasma technique, or the like. A layer of silicidable metal 148, preferably a layer of titanium at a thickness of between about 300 Å and 1300 Å (optimally about 700 Å), and a barrier film 152, preferably a layer of titanium nitride at a thickness of between about 100 Å and 600 Å (optimally about 300 Å), are deposited respectively over the etched structure 150 to form a layered structure 160, as shown in FIG. 18. The silicidable metal 148 and the barrier film 152 may be deposited by a known technique, including but not limited to plasma-enhanced chemical vapor deposition ("PECVD") and collimated physical vapor deposition ("PVD").

Figure 19:
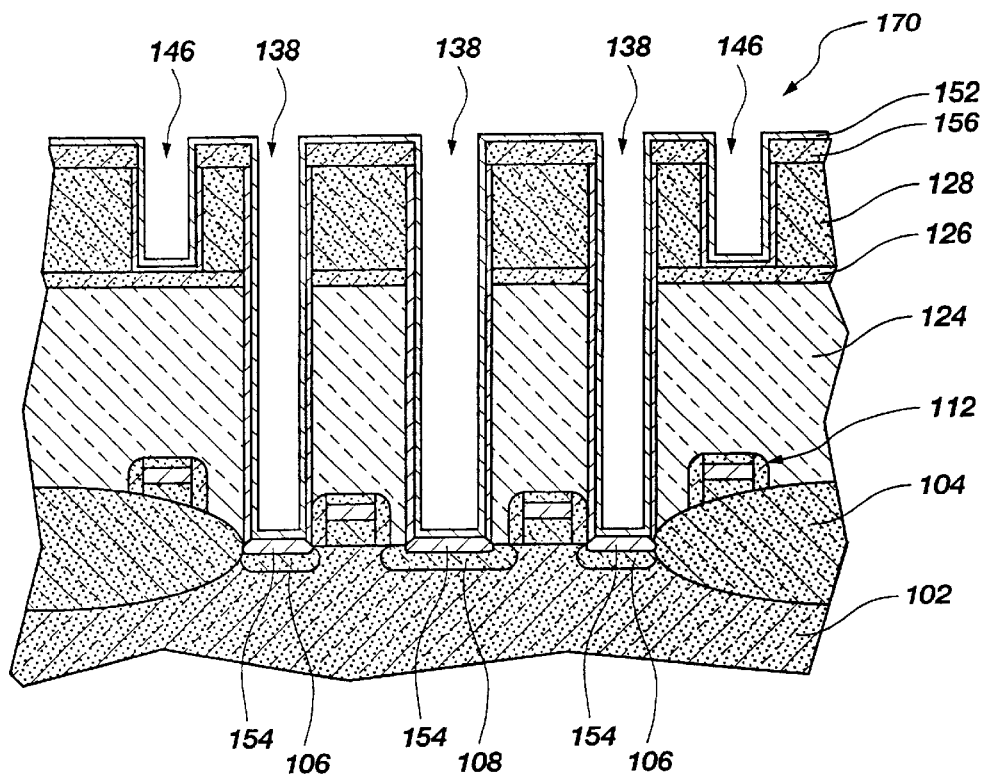
FIG. 19 is a side cross-sectional view of the layered structure after annealing to form a silicided structure according to the present invention.

The layered structure 160 is then annealed, such as by rapid thermal processing ("RTP"). The annealing forms contact silicide layers 154 by the reaction of the silicidable metal 148 with the drain regions 106 and source regions 108, as shown in FIG. 19. The contact silicide layers 154 are formed to reduce the contact resistance at the interface between the conductive material to be deposited in the contact openings 138 and the drain regions 106 or the source regions 108.

Additionally, the annealing forms mask silicide layer 156 by the reaction of the silicidable metal 148 with the silicon hard mask 132 to form a silicided structure 170, as also shown in FIG. 19. The mask silicide layer 156 is much more conducive to abrasive removal, such as by CMP, than a silicon hard mask. However, the thickness of the silicon hard mask 132 is limited to a proportional relationship to the thickness of the silicidable metal 148. For example, a common metal silicide material formed for contact silicide layers 154 is titanium silicide ($TiSi_x$, wherein x is predominately equal to 2—thus for every one titanium atom, two silicon atoms are used) generated from a deposited layer of titanium (i.e., silicidable metal 148). Thus, the silicon hard mask 132 can only be as thick as the silicidable metal 148 is capable of forming into a metal silicide material.

Figure 20:
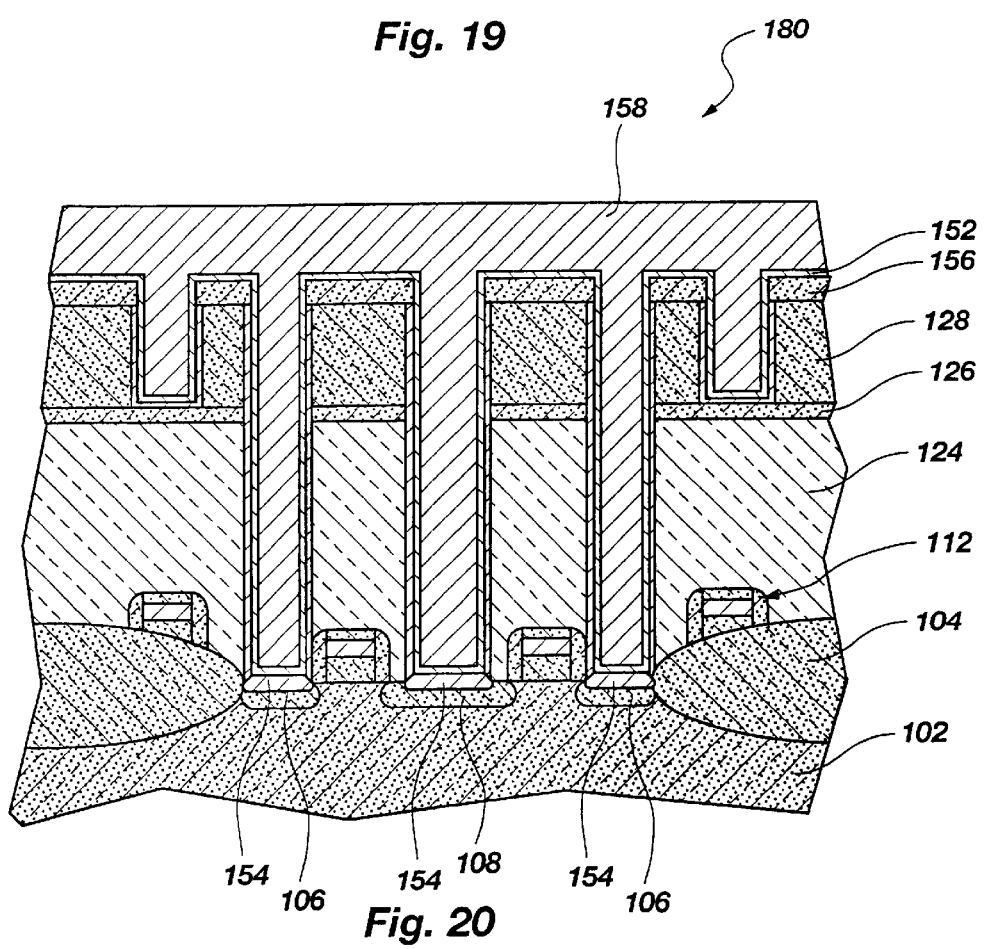
FIG. 20 is a side cross-sectional view of a conductive material deposited over the silicided structure filling the contact openings and the runner trenches according to the present invention.
Figure 21:
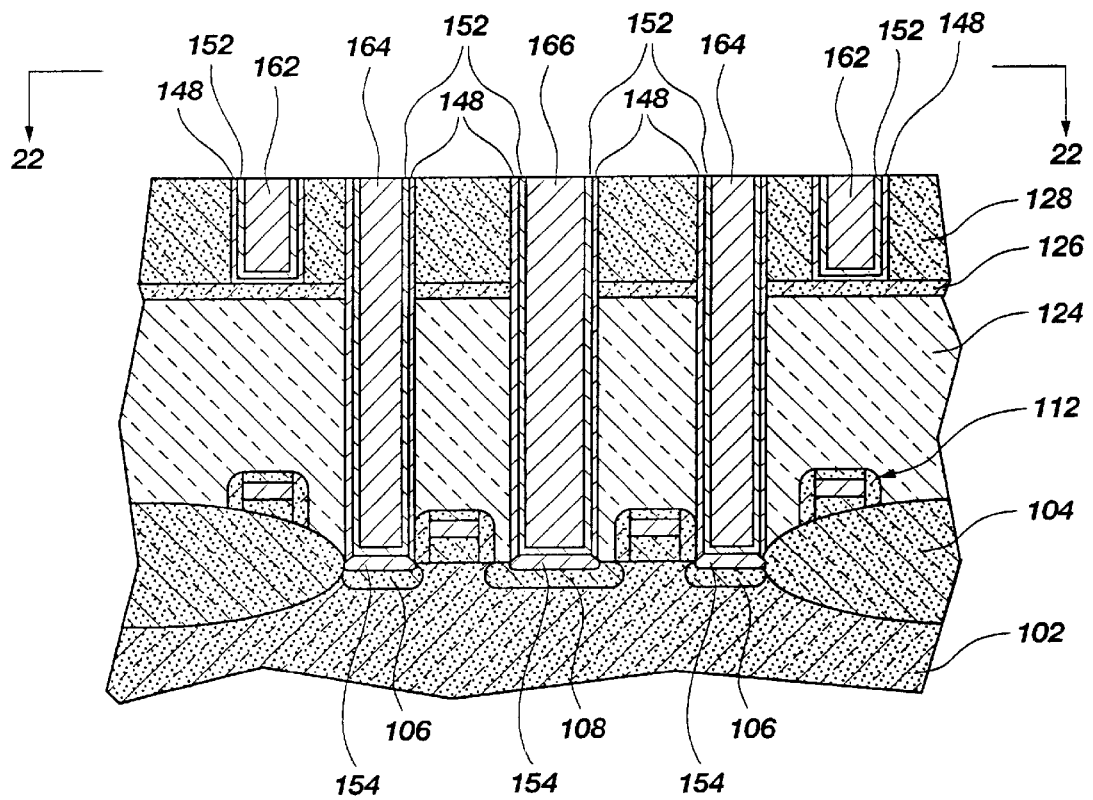
FIG. 21 is a side cross-sectional view of an upper portion of the conductive material and the mask silicide layer removed to separate the conductive material within the contact openings and runner trenches to form runners, capacitor contacts, and bitline contacts according to the present invention.

As shown in FIG. 20, a conductive material 158 is deposited over the silicided structure 170 to fill contact openings 138 and runner trenches 146 (see FIG. 19), to form structure 180. The conductive material 158 is preferably a metal, including but not limited to copper, silver, gold, aluminum (preferred), and alloys thereof. However, conductive polymers may be used. The deposition of the conductive material 158 may be effected by methods including, but not limited to, hot sputter/reflow, ionized plasma, hot-pressure fill, as well as PVD and CVD combinations. As shown in FIG. 21, an upper portion of the conductive material 158 and the mask silicide layer 156 are removed, preferably using an abrasive process, such as chemical mechanical planarization (CMP). The removal of the upper portion of the conductive material 158 and the mask silicide layer 156 effectuates the separation of the conductive material within the contact openings 138 and runner trenches 146 (see FIG. 19) to form runners 162, capacitor contacts 164 (in electrical communication with the drain regions 106), and bitline contacts 166 (in electrical communication with the source regions 108).

Figure 22:
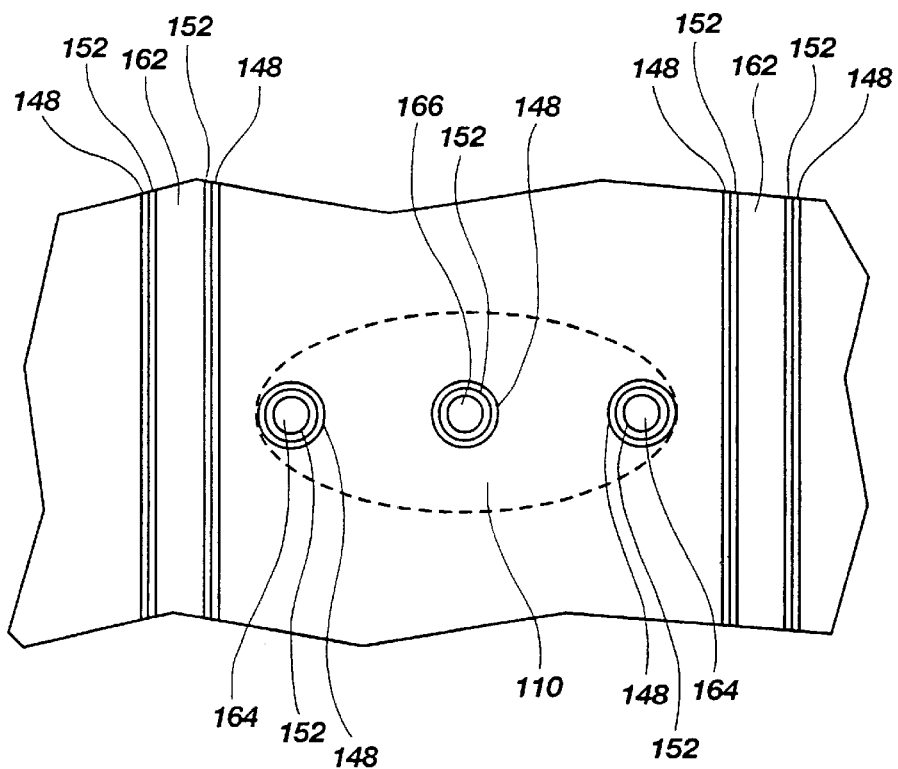
FIG. 22 is a top plan view along line 22—22 of FIG. 21.

FIG. 22 is a top plan view of the long line 22—22 of FIG. 21. FIG. 22 shows the capacitor contacts 164, the bitline contacts 166, and the runners 162. The substrate active area 110 (see FIG. 9) is shown in shadow for visual orientation.

Figure 23:
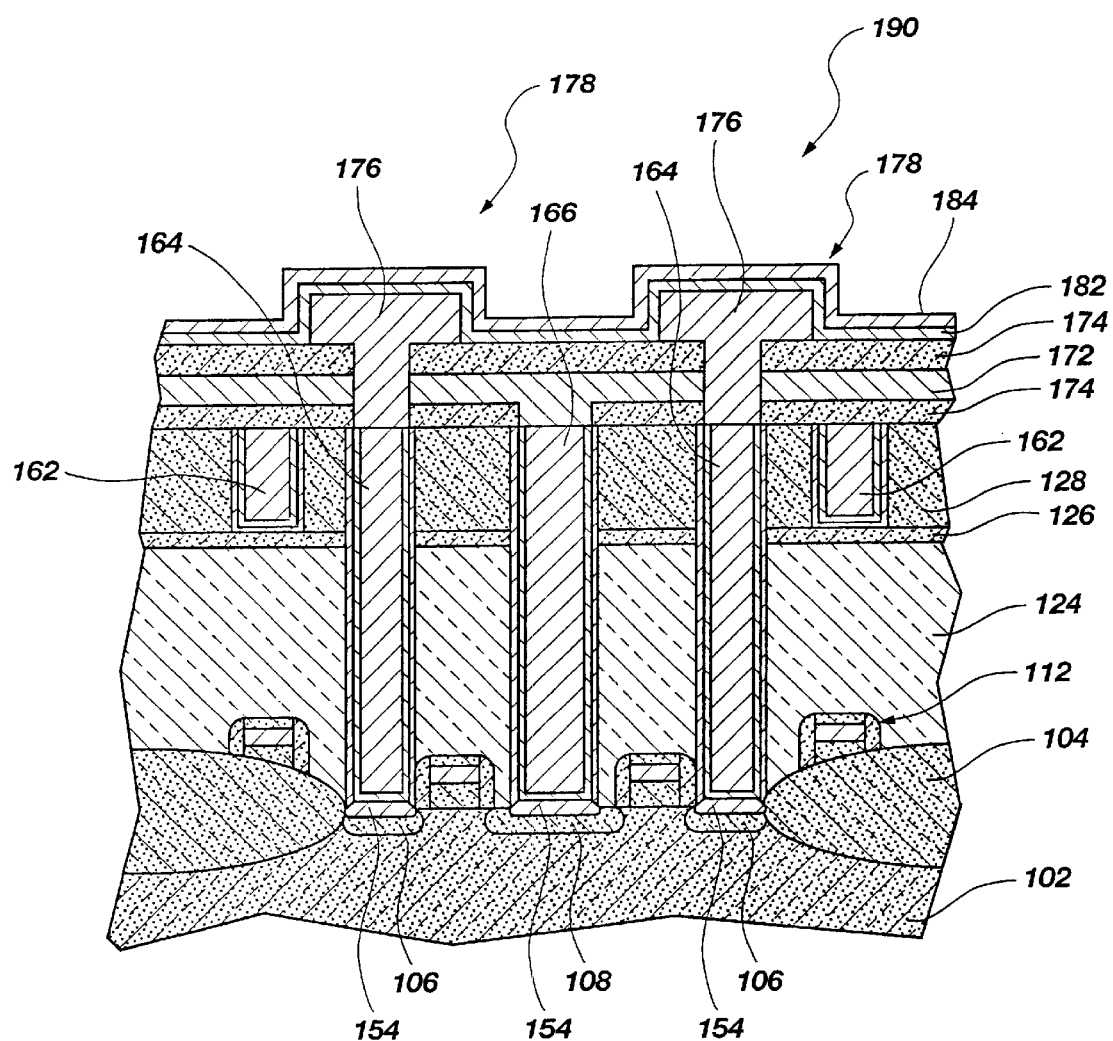
FIG. 23 is a side cross-sectional view of a memory array of a dynamic random access memory (DRAM) chip formed by a method according to the present invention.

FIG. 23 illustrates a completed memory array 190 of a DRAM semiconductor chip. A bitline 172 is formed in an insulating layer 174 to make electrical contact with the bitline contact 166. Conductive capacitor structures 176 are formed to extend from the capacitor contacts 164. Capacitors 178 are completed by respectively depositing a dielectric layer 182 and a conductive upper cell plate layer 184, such as platinum, over the conductive capacitor structures 176 and the insulating layer 174.

It is, of course, understood that the present invention is not limited to dual damascene type fabrication. A silicon hard mask can be used in the manner described in the present invention for the fabrication of trenches and contact openings separately, as well as in the fabrication of any structures which are formed by an etching process.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of forming a semiconductor device having an active element on a first surface of a substrate, a barrier layer over said substrate first surface, a silicon hard mask over said barrier layer, a silicidable material over said silicon hard mask, and at least one contact opening through said silicidable material, said silicon hard mask and said barrier layer to expose said active element, the method comprising:

annealing said silicidable material to form a mask silicide layer from a reaction between said silicon hard mask and said silicidable material; and removing said mask silicide layer.

2. The method of claim 1, wherein said removing said mask silicide layer is effected by abrasion.

3. The method of claim 1, wherein said removing said mask silicide layer is effected by chemical mechanical planarization.

4. A method of forming a semiconductor device having an active element on a first surface of a substrate, a barrier layer over said substrate first surface, a silicon hard mask over said barrier layer, a silicidable material over said silicon hard mask, and at least one contact opening through said silicidable material, said silicon hard mask and said barrier layer to expose said active element, the method comprising:

annealing said silicidable material to form a mask suicide layer from a reaction between said silicon hard mask and said silicidable material; and depositing a conductive material within said at least one contact opening.

5. The method of claim 4, further comprising removing said mask silicide layer.

6. The method of claim 5, wherein said removing said mask silicide layer is effected by abrasion.

7. The method of claim 5, wherein said removing said mask silicide layer is effected by chemical mechanical planarization.

8. The method of claim 5, wherein said mask silicide layer is removed prior to depositing said conductive material within said at least one contact opening.

9. The method of claim 5, wherein said mask silicide layer is removed after depositing said conductive material within said at least one contact opening.

10. A method of forming a DRAM chip, comprising:

providing a substrate having an active element on a first surface thereof, a dielectric layer over said substrate first surface, a polysilicon mask over said dielectric layer, a silicidable material over said polysilicon mask, and at least one contact opening through said silicidable material, said polysilicon mask and said dielectric layer to expose said active element;

annealing said silicidable material to form a mask silicide layer from a reaction between said polysilicon mask and said; silicidable material; and removing said mask silicide layer.

11. The method of claim 10, wherein said removing said mask silicide layer is effected by abrasion.

12. The method of claim 10, wherein said removing said mask silicide layer is effected by chemical mechanical planarization.

13. A method of forming a DRAM chip, comprising:

providing a substrate having an active element on a first surface thereof, a dielectric layer over said substrate first surface, a polysilicon mask over said dielectric layer, a silicidable material over said polysilicon mask, and at least one contact opening through said silicidable material, said polysilicon mask and said dielectric layer to expose said active element;

annealing said silicidable material to form a mask suicide layer from a reaction between said polysilicon mask and said silicidable material; and depositing a conductive material within said at least one contact opening.

14. The method of claim 13, further comprising removing said mask silicide layer.

15. The method of claim 14, wherein said removing said mask suicide layer is effected by abrasion.

16. The method of claim 14, wherein said removing said mask silicide layer is effected by chemical mechanical planarization.

17. The method of claim 14, wherein said mask silicide layer is removed prior to depositing said conductive material within said at least one contact opening.

18. The method of claim 14, wherein said mask silicide layer is removed after depositing said conductive material within said at least one contact opening.

* * * * *